United States Patent
Zhang et al.

(10) Patent No.: US 12,119,395 B2
(45) Date of Patent: Oct. 15, 2024

(54) INSULATED GATE BIPOLAR TRANSISTOR

(71) Applicants: SOUTHEAST UNIVERSITY, Jiangsu (CN); CSMC TECHNOLOGIES FAB2 CO., LTD., Wuxi (CN)

(72) Inventors: Long Zhang, Wuxi (CN); Jie Ma, Wuxi (CN); Yan Gu, Wuxi (CN); Sen Zhang, Wuxi (CN); Jing Zhu, Wuxi (CN); Jinli Gong, Wuxi (CN); Weifeng Sun, Wuxi (CN); Longxing Shi, Wuxi (CN)

(73) Assignees: SOUTHEAST UNIVERSITY, Jiangsu (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 339 days.

(21) Appl. No.: 17/762,212

(22) PCT Filed: Aug. 26, 2020

(86) PCT No.: PCT/CN2020/111385
§ 371 (c)(1),
(2) Date: Mar. 21, 2022

(87) PCT Pub. No.: WO2021/088478
PCT Pub. Date: May 14, 2021

(65) Prior Publication Data
US 2022/0376094 A1   Nov. 24, 2022

(30) Foreign Application Priority Data
Nov. 4, 2019   (CN) .......................... 201911065246.6

(51) Int. Cl.
*H01L 29/739* (2006.01)
*H01L 29/06* (2006.01)
(Continued)

(52) U.S. Cl.
CPC ...... *H01L 29/7394* (2013.01); *H01L 29/0623* (2013.01); *H01L 29/0834* (2013.01); *H01L 29/1095* (2013.01)

(58) Field of Classification Search
CPC ............ H01L 29/7394; H01L 29/0623; H01L 29/0834; H01L 29/1095; H01L 29/7393;
(Continued)

(56) References Cited

U.S. PATENT DOCUMENTS 5,654,561 A * 8/1997 Watabe ............... H01L 27/0623
257/E29.037
6,605,844 B2 * 8/2003 Nakamura .......... H01L 27/0262
257/361
(Continued)

FOREIGN PATENT DOCUMENTS

| CN | 102760761 A | 10/2012 |
| CN | 103779404 A | 5/2014 |

(Continued)

OTHER PUBLICATIONS

PCT International Search Report and Written Opinion (w/ English translations) for corresponding Chinese Application No. PCT/CN2020/111385, mailed Dec. 4, 2020, 10 pages.

(Continued)

*Primary Examiner* — Jesse Y Miyoshi
*Assistant Examiner* — Andrew Chung
(74) *Attorney, Agent, or Firm* — Dority & Manning, P.A.

(57) ABSTRACT

An insulated gate bipolar transistor, comprising an anode second conductivity-type region and an anode first conductivity-type region provided on a drift region; the anode first conductivity-type region comprises a first region and a second region, and the anode second conductivity-type region comprises a third region and a fourth region, the dopant concentration of the first region being less than that
(Continued)

of the second region, the dopant concentration of the third region being less than that of the fourth region, the third region being provided between the fourth region and a body region, the first region being provided below the fourth region, and the second region being provided below the third region and located between the first region and the body region.

18 Claims, 2 Drawing Sheets

(51) Int. Cl.
    *H01L 29/08*        (2006.01)
    *H01L 29/10*        (2006.01)

(58) Field of Classification Search
    CPC .......... H01L 29/66325; H01L 29/0804; H01L 29/0808; H01L 29/0821
    See application file for complete search history.

(56) References Cited

U.S. PATENT DOCUMENTS

| | | | |
|---|---|---|---|
| 9,166,005 B2 | 10/2015 | Schulze et al. | |
| 9,397,090 B1 | 7/2016 | Chen et al. | |
| 2009/0243042 A1* | 10/2009 | Hayakawa | H01L 29/0834 |
| | | | 257/E29.187 |
| 2012/0061726 A1* | 3/2012 | Tokura | H01L 29/405 |
| | | | 257/141 |
| 2012/0161201 A1 | 6/2012 | Hsieh | |
| 2014/0217463 A1 | 8/2014 | Schulze et al. | |
| 2015/0108542 A1* | 4/2015 | Yang | H01L 29/0834 |
| | | | 257/141 |

FOREIGN PATENT DOCUMENTS

| | | | | |
|---|---|---|---|---|
| CN | 108447904 A | | 8/2018 | |
| CN | 109742139 A | * | 5/2019 | |
| CN | 110034176 A | * | 7/2019 | |
| CN | 110190113 A | | 8/2019 | |
| CN | 110571264 A | * | 12/2019 | ......... H01L 29/0821 |

OTHER PUBLICATIONS

Chinese Office Action for corresponding Chinese Application No. 201911065246.6 - 6 pages.
Hu et al., "A Novel Low Turn-Off Loss and Snapback-Free Reverse-Conducting SOI-LIGBT With Integrated Polysilicon Diodes," IEEE Transactions on Electron Devices, vol. 66, No. 10, Oct. 2019, pp. 4296-4301.
Extended European Search Report for corresponding Application No. 20884449.8, dated Jun. 20, 2023, 7 pages.

* cited by examiner

INSULATED GATE BIPOLAR TRANSISTOR

CROSS-REFERENCE TO RELATED APPLICATIONS

The present application is a national phase application under 35 USC § 371(c) of PCT Application No. PCT/CN2020/111385, filed Aug. 26, 2020, which claims the right of priority to Chinese application No. 2019110652466, filed Nov. 4, 2019, both of which are incorporated herein by reference in their entireties for all purposes.

TECHNICAL FIELD

The present disclosure relates to the field of semiconductor manufacturing, and more particularly relates to an insulated gate bipolar transistor.

BACKGROUND

For the conventional insulated gate bipolar transistor (IGBT) device, if the device wants to obtain a lower on-state voltage drop Von, the carrier implantation efficiency thereof needs to be enhanced. However, the size of a safety operating area (SOA) of the device may be reduced, meanwhile, the increased carrier concentration may lower the switching speed when the device is switched, and may result in a tail current, thereby making the turn-off loss high.

SUMMARY

Accordingly, it is necessary to provide an insulated gate bipolar transistor with low on-state voltage drop and large safe operating area.

An insulated gate bipolar transistor includes: a drift region of a first conductivity type; a body region of a second conductivity type disposed on the drift region; a cathode first conductivity-type region and a cathode second conductivity-type region both disposed within the body region; an anode first conductivity-type region disposed on the drift region; and an anode second conductivity-type region disposed on the drift region. The anode first conductivity-type region includes a first region and a second region; and the anode second conductivity-type region includes a third region and a fourth region. A dopant concentration of the first region is less than a dopant concentration of the second region; and a dopant concentration of the third region is less than a dopant concentration of the fourth region. The third region is disposed between the fourth region and the body region. The first region is disposed below the fourth region. The second region is disposed below the third region and disposed between the first region and the body region. The first conductivity type is opposite to the second conductivity type.

The details of one or more embodiments of the present disclosure are set forth in the following drawings and description. Other features, purposes and advantages of present disclosure will become apparent from the description, drawings and claims.

BRIEF DESCRIPTION OF THE DRAWINGS

In order to better describe and explain the embodiments and/or examples of the present disclosure herein, one or more drawings can be referred to. The additional details or examples used to describe the drawings should not be considered as limiting the scope of any one of the disclosed inventions, the described embodiments and/or examples, and the preferred embodiments of the present disclosure.

DETAILED DESCRIPTION OF THE EMBODIMENTS

Figure 1:
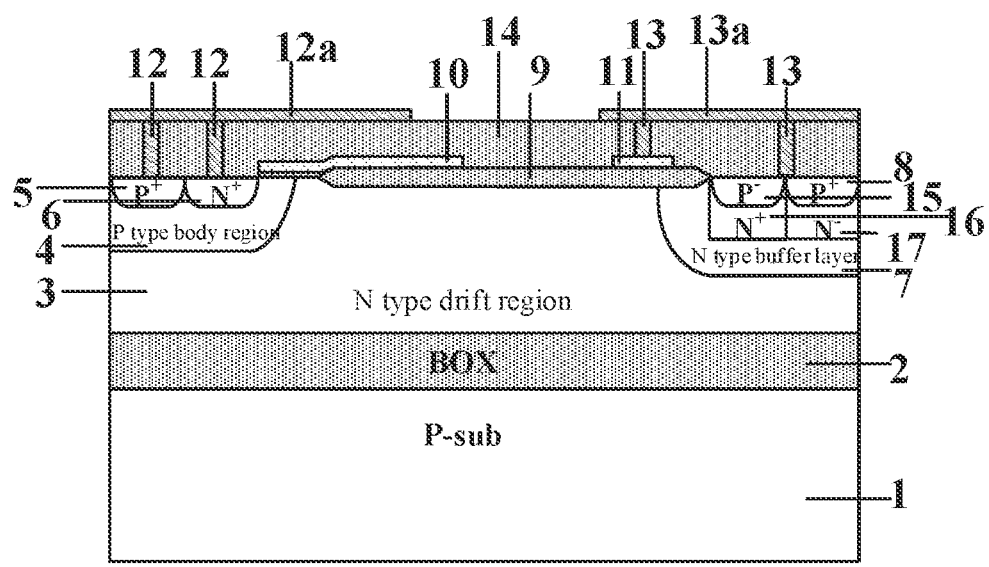
FIG. 1 is a schematic cross-sectional view of an insulated gate bipolar transistor (IGBT) in an embodiment.

For the convenience of understanding the present disclosure, a more comprehensive description of the present disclosure will be made by referring the accompanying drawings below. A preferred embodiment of the present disclosure is given in the accompanying drawings. However, the present disclosure may be implemented in many different forms and is not limited to the embodiments described herein. Rather, the purpose of providing these embodiments is to make the disclosure of the present disclosure more thorough and comprehensive.

Unless otherwise defined, all terms (including technical and scientific terms) used herein have the same meaning as commonly understood by those persons skilled in the art. The terms used in the description of the present disclosure are only for the purpose of describing specific embodiments, and are not intended to limit the present disclosure. The term "and/or" used herein should include any one of and all of the combinations of one or more relevant listed items.

It should be understood that when an element or layer is referred to as being "on", "adjacent to". "connected to" or "coupled to" other elements or layers, it can be directly on, directly adjacent to, directly connected to, or directly coupled to the other elements or layers, or there may be a intervening element or layer therebetween. In contrast, when an element is referred to as being "directly on", "directly adjacent to", "directly connected to" or "directly coupled to" other elements or layers, there is no intervening element or layer therebetween. It should be understood that although the terms such as first, second, third, and the like can be used to describe various elements, components, regions, layers and/or portions, these elements, components, regions, layers and/or portions should not be limited by these terms. These terms are only used to distinguish an element, a component, a region, a layer or a portion from another element, another component, another region, another layer or another portion. Therefore, a first element, a first component, a first region, a first layer or a first portion discussed hereinafter can be represented as a second element, a second component, a second region, a second layer or a second portion, respectively, without departing from the teachings of the present disclosure.

For the convenience of description, the spatial relationship terms such as "under", "below", "beneath", "above", "over", "on" and the like are used herein to describe the relationship between an element or a feature and other elements or features shown in the figures. It should be understood that, in addition to the orientations shown in the figures, the spatial relationship terms are intended to include different orientations of devices in use and operation. For example, if a device in the figures is reversed, an element or a feature, which is described as being "below", "under", or "beneath" other elements, can be oriented as being "over", "above", or "on" the other elements or features. Therefore, the exemplary terms such as "under", "below", "beneath"

can include both an upward orientation and a downward orientation, respectively. The device can be otherwise oriented (rotated by 90 degrees or other orientations) and the spatial relationship terms used herein are interpreted accordingly.

The purpose of the terms used herein is only to describe specific embodiments and not as a limitation of the present disclosure. The singular form articles "a" "an", and "the", when used herein, are intended to include plural forms, unless the context clearly indicates a specific form. It should also be understood that the terms "comprise", and/or "include", when used herein, are intended to determine the existence of a feature, an integer, a step, an operation, an element and/or a component, but not exclude the existence or addition of one or more other features, integers, steps, operations, elements, components, and/or a combination thereof. The term "and/or", when used herein, includes any one of and all combinations of related listed items.

The various embodiments of the present disclosure are described herein with reference to a cross-sectional view which is a schematic view of referred embodiments (including an intermediate structure) of the present disclosure. In this way, any changes from the shown shape due to, for example, the manufacturing technology and/or tolerances can be expected. Therefore, the various embodiments of the present disclosure should not be limited to specific shapes in areas shown in the figures, but include shape deviations due to, for example, manufacturing. For example, an implanted region shown as a rectangle generally has a rounded feature or curved feature at its edge and/or has an implanted concentration gradient, rather than has a binary change from an implanted region to a non-implanted region. Likewise, since a buried region is formed by a performing process, there may be an implantation in a certain region between surfaces through which the implantation is performed when performing the implanting process and forming the buried region. Therefore, the regions shown in the figures are substantially schematic, and their shapes are not intended to show the actual shapes of the regions of the device, and are not intended to limit the scope of the present disclosure.

The semiconductor field of terms used herein are common technical terms used by a person skilled in the art, for example, as to a P type impurity and an N type impurity, in order to a distinguish dopant concentration, the P+ type is simply represented as a P type with heavily dopant concentration, the P type is represented as a P type with normal dopant concentration, the P− type is represented as a P type with lightly dopant concentration, the N+ type is simply represented as a N type with heavily dopant concentration, the N type is represented as a N type with normal dopant concentration, and the N− type is represented as a N type with lightly dopant concentration.

In order to obtain a low on-state voltage drop and a large safe operating area of an insulated gate bipolar transistor (IGBT), the anode implantation of minority carriers needs to be enhanced when the IGBT is in an on-state, and to be weakened or ideally eliminated during a turn-off or short-circuit switching. Those have been achieved in the dynamic N-buffer insulated gate bipolar transistor (DB-IGBT) and the double trench insulated gate bipolar transistor (DT-IGBT). However, both of the devices require two gates, and during a turn-off process and a short-circuit switching process, the time phases of switching signals of the two gates needs to be accurately controlled to obtain the ideal performance, which makes the drive circuit therefor complicated.

FIG. 1 is a schematic cross-sectional view of an insulated gate bipolar transistor (IGBT) in an embodiment. The IGBT includes a drift region 3, a body region 4, a cathode first conductivity-type region 6, a cathode second conductivity-type region 5, an anode first conductivity-type region (including a first region 17 and a second region 16), and an anode second conductivity-type region (including a third region 15 and a fourth region 8).

The body region 4 of the second conductivity type is disposed on the drift region 3 of the first conductivity type. The cathode first conductivity-type region 6 and the cathode second conductivity-type region 5 are disposed within the body region 4. The anode first conductivity-type region and the anode second conductivity-type region are disposed on the drift region 3. In the embodiment shown in FIG. 1, the first conductivity type is an N type, and the second conductivity type is a P type. In another embodiment, the first conductivity type is a P type, and the second conductivity type is an N type.

A dopant concentration of the first region 17 is less than a dopant concentration of the second region 16, and a dopant concentration of the third region 15 is less than a dopant concentration of the fourth region 8. The third region 15 is disposed between the fourth region 8 and the body region 4, and the first region 17 is disposed below the fourth region 8. The second region 16 is disposed below the third region 15 and disposed between the first region 17 and the body region 4. In the embodiment shown in FIG. 1, a distance between the third region 15 and the body region 4 is less than a distance between the fourth region 8 and the body region 4, and a distance between the second region 16 and the body region 4 is less than a distance between the first region 17 and the body region 4.

In the embodiment shown in FIG. 1, the IGBT further includes a buffer layer 7 of the first conductivity type. The anode first conductivity-type region and the anode second conductivity-type region are disposed within the buffer layer 7. In an embodiment, a dopant concentration of the buffer layer 7 is less than the dopant concentration of the second region 16 and greater than the dopant concentration of the first region 17. Further, the dopant concentration of the buffer layer 7 is lower than the dopant concentration of the second region 16 by an order of magnitude, and is higher than the dopant concentration of the first region 17 by an order of magnitude. In the embodiment shown in FIG. 1, the buffer layer 7 is an N type buffer layer.

In the embodiment shown in FIG. 1, a dopant concentration of the body region 4 is lower than a dopant concentration of the cathode second conductivity-type region 5. Further, the dopant concentration of the body region 4 is lower than the dopant concentration of the cathode second conductivity-type region 5 by an order of magnitude.

In the embodiment shown in FIG. 1, the first region 17 is a N− type region, the second region 16 is a N+ type region, the third region 15 is a P− type region, the fourth region 8 is a P+ type region, the body region 4 is a P type body region, the cathode first conductivity-type region 6 is a N+ type region, and the cathode second conductivity-type region 5 is a P+ type region.

Figure 2:
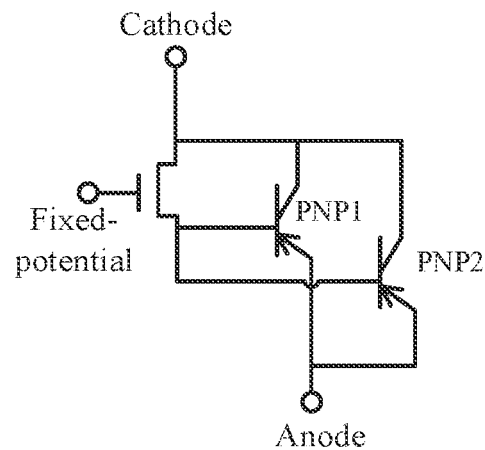
FIG. 2 is an equivalent circuit diagram of the IGBT shown in FIG. 1.

FIG. 2 is an equivalent circuit diagram of the IGBT shown in FIG. 1. The insulated gate bipolar transistor is equivalent to a transistor having a first triode PNP1 and a second triode PNP2. A collector of the first triode PNP1 includes the body region 4. A base thereof includes the drift region 3, the buffer layer 7, and the first region 17. An emitter thereof includes the fourth region 8. A collector of the second triode PNP2 includes the body region 4. A base thereof includes the drift region 3, the buffer layer 7 and the second region 16. An emitter thereof includes the third region 15.

Figure 3:
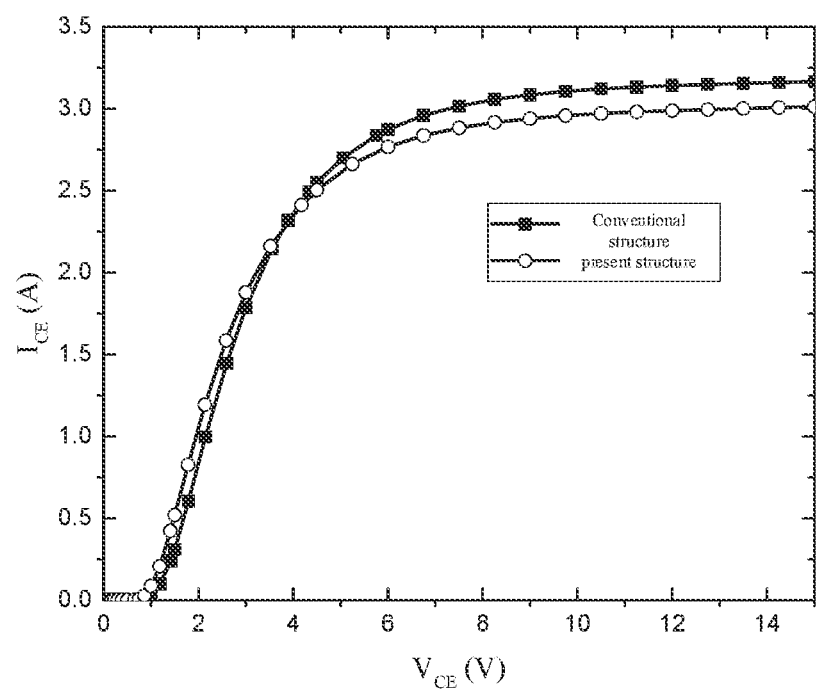
FIG. 3 is an $I_{CE}$-$V_{CE}$ (collector-emitter current-collector-emitter voltage) comparison diagram between a present disclosure structure and a conventional structure.

In the above-mentioned insulated gate bipolar transistor, the anode second conductivity-type region is divided into the lightly doped third region 15 and the heavily doped fourth region 8, and the anode first conductivity-type region is disposed below the anode second conductivity-type region and includes the lightly doped first region 17 below the fourth region 8 and the heavily doped second region 16 below the third region 15. Due to the introduction of the additional first region 17, when the anode is implanted by holes from the fourth region 8, in order to achieve a charge balance, the hole implantation efficiency of the fourth region 8 may increase. Due to the introduction of the additional second region 16 and the third region 15, and since the dopant concentration of the second region 16 is greater than the dopant concentration of the first region 17, the hole implantation efficiency of the third region 15 will be lower than the hole implantation efficiency of the fourth region 8. The above-mentioned insulated gate bipolar transistor is equivalent to the transistor having two triodes: the first triode PNP1 formed by the fourth region 8, the first region 17/the buffer layer 7/the drift region 3, and the body region 4, and the second triode PNP2 formed by the third region 15, the second region 16/the buffer layer 7/the drift region 3, and the body region 4. (1) When the anode voltage is small (the device works in a linear current area), the electron current, which acts as the driving current of the bases of the two triodes, prompts holes to be implanted into the first region 17 and the second region 16 from the third region 15 and the fourth region 8 of the anode. Therefore, the implanted holes form the current of emitters the two triodes. Since the first region 17 is N− type, the emitter area needs to contribute more electrons. When the electron current flows to the collector, the collector area attracts more holes to be implanted. Since the implantation efficiency of the second triode PNP2 is lower than the implantation efficiency of the first triode PNP1, the anode current mainly flows through the first triode PNP1. Since the hole concentration of the first region 17 is low, and the hole implantation efficiency of the fourth region 8 is higher than the hole implantation efficiency of the conventional structure, the on-state voltage of the structure of the present disclosure is low. (2) As the anode current and voltage increase (the device works in a saturation current area), the hole implantation efficiency of the first triode PNP1 decreases, and more current flows through the second triode PNP2, and the hole implantation efficiency of the second triode PNP2 is low, such that the saturation current of the device is suppressed. As shown in FIG. 3, the linear current of the structure of the present disclosure is greater than the linear current of the conventional structure, and the saturation current thereof is lower than the saturation current of the conventional structure. In summary, the above-mentioned insulated gate bipolar transistor can improve the hole implantation efficiency in the linear current area and obtain a lower on-state voltage drop, and can reduce the saturation current in the saturation current area to obtain a larger safe operating area.

In the embodiment shown in FIG. 1, the insulated gate bipolar transistor further includes substrate 1 of the second conductivity type and a buried oxygen layer BOX on the substrate 1. The drift region 3 is disposed on the buried oxygen layer BOX. Specifically, the substrate 1 can be a P type substrate.

In the embodiment shown in FIG. 1, the insulated gate bipolar transistor further includes a field oxygen layer 9 disposed between the body region 4 and the anode second conductivity-type region. Specifically, a side of the field oxygen layer 9 can extend to an edge of the third region 15 and an edge of the second region 16, and can cover a portion of the buffer layer 7.

In the embodiment shown in FIG. 1, the insulated gate bipolar transistor further includes a first polysilicon 10 and a second polysilicon 11. The second polysilicon 11 is disposed on the field oxygen layer 9, and the first polysilicon 10 extends from the field oxygen layer 9 to the cathode first conductivity-type region 6. In the embodiment shown in FIG. 1, a dielectric layer (not labeled in FIG. 1) is disposed below a portion of the first polysilicon 10 located outside the field oxygen layer 9, that is, the dielectric layer is disposed at a region between the field oxygen layer 9 and the cathode first conductivity-type region 6 and on the drift region 3 and the body region 4. The first polysilicon 10 is disposed on the dielectric layer.

In the embodiment shown in FIG. 1, an insulating layer 14 is further disposed on a surface of the insulated gate bipolar transistor. A first electrode 12a and a second electrode 13a are disposed on the insulating layer 14. The first electrode 12a is electrically connected and leads to the cathode first conductivity-type region 6 and the cathode second conductivity-type region 5 through a first contact hole 12 which is filled with a conductive material (such as metal or alloy). The second electrode 13a is electrically connected and leads to the second polysilicon 11 through a contact hole 13, and is electrically connected and leads to the third region 15 and the fourth region 8 through another contact hole 13.

The forgoing embodiments are merely illustrative of several embodiments of the present disclosure, and the description thereof is more specific and detailed, but is not to be construed as limiting the scope of the present disclosure. It should be noted that several variations and modifications may be made by those persons skilled in the art without departing from the spirit, which all fall within the protection scope of the present disclosure. Therefore, the scope of protection of the present disclosure should be subject to the appended claims.

What is claimed is:
1. An insulated gate bipolar transistor, comprising:
a drift region of a first conductivity type;
a body region of a second conductivity type disposed on the drift region;
a cathode first conductivity-type region disposed within the body region;
a cathode second conductivity-type region disposed within the body region;
an anode first conductivity-type region disposed on the drift region, and comprising a first region and a second region; and
an anode second conductivity-type region disposed on the drift region, and comprising a third region and a fourth region;
wherein a dopant concentration of the first region is less than a dopant concentration of the second region;
a dopant concentration of the third region is less than a dopant concentration of the fourth region;
the third region is disposed between the fourth region and the body region;
the first region is disposed below the fourth region;
the second region is disposed below the third region and between the first region and the body region;
the first conductivity type is opposite to the second conductivity type, wherein the first conductivity type is an N type, and the second conductivity type is a P type; and further comprising a buffer layer of the first conductivity type; and
the anode first conductivity-type region and the anode second conductivity-type region are disposed within the buffer layer.

2. The insulated gate bipolar transistor according to claim 1, further comprising a substrate of the second conductivity type and a buried oxygen layer disposed on the substrate; and
the drift region is disposed on the buried oxygen layer.

3. The insulated gate bipolar transistor according to claim 1, further comprising a field oxygen layer disposed between the body region and the anode second conductivity-type region.

4. The insulated gate bipolar transistor according to claim 1, wherein a distance between the third region and the body region is less than a distance between the fourth region and the body region.

5. The insulated gate bipolar transistor according to claim 1, wherein a distance between the second region and the body region is less than a distance between the first region and the body region.

6. The insulated gate bipolar transistor according to claim 1, wherein a dopant concentration of the body region is lower than a dopant concentration of the cathode second conductivity-type region by an order of magnitude.

7. The insulated gate bipolar transistor according to claim 1, wherein a dopant concentration of the buffer layer is lower than the dopant concentration of the second region by an order of magnitude.

8. The insulated gate bipolar transistor according to claim 7, wherein the dopant concentration of the buffer layer is higher than the dopant concentration of the first region by an order of magnitude.

9. The insulated gate bipolar transistor according to claim 1, wherein the insulated gate bipolar transistor is equivalent to a transistor having a first triode and a second triode;
a collector of the first triode comprises the body region, a base of the first triode comprises the drift region, the buffer layer, and the first region, and an emitter of the first triode comprises the fourth region; and
a collector of the second triode comprises the body region, a base of the second triode comprises the drift region, the buffer layer, and the second region, and an emitter of the second triode comprises the third region.

10. The insulated gate bipolar transistor according to claim 1, wherein the first region is an N− type region, the second region is a N+ type region, the third region is a P− type region, the fourth region is a P+ type region, the body region is a P type body region, the cathode first conductivity-type region is an N+ type region, and the cathode second conductivity-type region is a P+ type region.

11. The insulated gate bipolar transistor according to claim 3, wherein a side of the field oxygen layer extends to an edge of the third region and an edge of the second region.

12. The insulated gate bipolar transistor according to claim 3, further comprising a first polysilicon and a second polysilicon;
the first polysilicon extends from the field oxygen layer to the cathode first conductivity-type region; and
the second polysilicon is disposed on the field oxygen layer.

13. The insulated gate bipolar transistor according to claim 12, further comprising a dielectric layer disposed at a region between the field oxygen layer and the cathode first conductivity-type region and disposed on the drift region and the body region; and
the first polysilicon is disposed on the dielectric layer.

14. The insulated gate bipolar transistor according to claim 7, wherein the insulated gate bipolar transistor is equivalent to a transistor having a first triode and a second triode;
a collector of the first triode comprises the body region, a base of the first triode comprises the drift region, the buffer layer, and the first region, and an emitter of the first triode comprises the fourth region; and
a collector of the second triode comprises the body region, a base of the second triode comprises the drift region, the buffer layer, and the second region, and an emitter of the second triode comprises the third region.

15. The insulated gate bipolar transistor according to claim 1, further comprising an insulating layer disposed on a surface of the insulated gate bipolar transistor and provided with a first electrode and a second electrode thereon.

16. The insulated gate bipolar transistor according to claim 12, further comprising a first electrode and a second electrode;
wherein the first electrode is electrically connected and leads to the cathode first conductivity-type region and the cathode second conductivity-type region through a first contact hole which is filled with a conductive material; and
the second electrode is electrically connected and leads to the second polysilicon through a second contact hole, and is electrically connected and leads to the third region and the fourth region through a third contact hole.

17. The insulated gate bipolar transistor according to claim 3, wherein a first triode is a first PNP triode; and
a second triode is a second PNP triode.

18. An insulated gate bipolar transistor, comprising:
a drift region of a first conductivity type;
a body region of a second conductivity type disposed on the drift region;
a cathode first conductivity-type region disposed within the body region;
a cathode second conductivity-type region disposed within the body region;
an anode first conductivity-type region disposed on the drift region, and comprising a first region and a second region; and
an anode second conductivity-type region disposed on the drift region, and comprising a third region and a fourth region;
wherein a dopant concentration of the first region is less than a dopant concentration of the second region;
a dopant concentration of the third region is less than a dopant concentration of the fourth region;
the third region is disposed between the fourth region and the body region;
the first region is disposed below the fourth region;
the second region is disposed below the third region and between the first region and the body region; and
the first conductivity type is opposite to the second conductivity type;
further comprising a field oxygen layer disposed between the body region and the anode second conductivity-type region, wherein a side of the field oxygen layer extends to an edge of the third region and an edge of the second region, and wherein the field oxygen layer covers a portion of a buffer layer.

* * * * *